(12) United States Patent
Castillo Buenaventura (10) Patent No.: US 11,687,206 B2
(45) Date of Patent: Jun. 27, 2023

(54) REDUNDANT CAPACITIVE TOUCH SCREEN HAVING TWO SUBGRIDS OF ELECTRODES CONNECTED TO TWO SEPARATE CONTROLLERS

(71) Applicant: Schneider Electric Industries SAS, Rueil Malmaison (FR)

(72) Inventor: Felipe Castillo Buenaventura, Angoulême (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/671,674

(22) Filed: Feb. 15, 2022

(65) Prior Publication Data
US 2022/0269376 A1  Aug. 25, 2022

(30) Foreign Application Priority Data
Feb. 19, 2021 (EP) ..................................... 21305201

(51) Int. Cl.
G06F 3/044 (2006.01)
G06F 3/041 (2006.01)

(52) U.S. Cl.
CPC .......... *G06F 3/0446* (2019.05); *G06F 3/0418* (2013.01); *G06F 3/041661* (2019.05); *G06F 2203/04106* (2013.01)

(58) Field of Classification Search
CPC ............. G06F 3/0446; G06F 3/041661; G06F 3/0445; G06F 3/0416; G06F 3/0418; G06F 11/1629
See application file for complete search history.

(56) References Cited

U.S. PATENT DOCUMENTS

2012/0068953 A1* 3/2012 Chang ................ G01R 27/2605
345/173
2015/0109217 A1 4/2015 Zhu et al.
(Continued)

FOREIGN PATENT DOCUMENTS

EP 3106967 A1 12/2016
WO 2020246673 A1 12/2020

OTHER PUBLICATIONS

Extended European Search Report and Written Opinion dated Jul. 14, 2021 for corresponding European Patent Application No. 21305201.2-1231, 12 pages.

*Primary Examiner* — Darlene M Ritchie
(74) *Attorney, Agent, or Firm* — Locke Lord LLP (57) ABSTRACT

A touch screen system includes a touch screen; a capacitive grid associated with the touch screen and including a first capacitive sub-grid and a second capacitive sub-grid; a first controller configured to control the first capacitive sub-grid; and a second controller configured to control the second first capacitive sub-grid. The first controller and the second controller are configured to get respectively a first touch position and a second touch position after a touch input on the touch screen. The first controller and the second controller also are configured to test respectively a second channel associated with the second controller and a first channel associated with the first controller by sending a stimuli signal respectively to the first capacitive sub-grid and to the second capacitive sub-grid. At least one of the first controller and the second controller are configured to determine a consolidated touch position by correlation of the first touch position and the second touch position.

14 Claims, 7 Drawing Sheets

(56) References Cited

U.S. PATENT DOCUMENTS

| | | | |
|---|---|---|---|
| 2015/0185946 A1* | 7/2015 | Fourie | G06F 3/045 156/60 |
| 2015/0370396 A1* | 12/2015 | Hotelling | G06F 3/0447 345/174 |
| 2019/0384441 A1* | 12/2019 | Seo | G06F 3/0414 |
| 2021/0357063 A1* | 11/2021 | Sauer | G06F 3/0418 |

* cited by examiner

Channel C1  Channel C2

● Touch Output

FIG. 7

REDUNDANT CAPACITIVE TOUCH SCREEN HAVING TWO SUBGRIDS OF ELECTRODES CONNECTED TO TWO SEPARATE CONTROLLERS

FIELD OF INVENTION

The present disclosure relates generally to touch screens, more especially to capacitive touch screens.

BACKGROUND

Electronic touch screens (such as displays) are used in many commercial applications including ATMs, automobiles, informational displays, personal computers, cell phones, and the like. Such screens are advantageous as the content may be easily changed and the screens are interactive. An electronic touch screen is desirable for many applications, but requirements or needs for redundancy may prevent the use of such screens.

Examples of such applications include, but are not limited to, commercial aviation, space flight, military applications and industrial processes, where redundancy measures are demanded to ensure continued performance of equipment in the event of a partial failure. Such stringent requirements are demanded because of the potential consequences of failure.

There may be different approaches to increase the reliability of the touch sensing, nevertheless none of them allow addressing an online crosses diagnostic method to increase diagnostic coverage of the touch inputs while having a redundant system using only one capacitive touchscreen.

There is therefore a need for a touch screen system having high reliability and high diagnostic coverage.

SUMMARY

This summary is provided to introduce concepts related to the present inventive subject matter. This summary is not intended to identify essential features of the claimed subject matter nor is it intended for use in determining or limiting the scope of the claimed subject matter.

In one implementation, there is provided a touch screen system comprising:
a touch screen;
capacitive grid associated with the touch screen and comprising a first capacitive sub-grid and a second capacitive sub-grid;
a first channel controlling the first capacitive sub-grid;
a second channel controlling the second capacitive sub-grid;
wherein the first channel and the second channel are configured to get respectively a first touch position and a second touch position after a touch input on the touch screen,
wherein the first channel and the second channel are configured to test respectively the second channel and the first channel by sending a stimuli signal respectively to the first capacitive sub-grid and to the second capacitive sub-grid,
wherein at least one of the first channel and the second channel determines a consolidated touch position by correlation of the first touch position and the second touch position Advantageously, the system allows significantly improving the diagnostic coverage of the touch screen system with capacitive grid by means of an advanced cross sensing and monitoring technique through the first channel and the second channel. More precisely, it enables a standard capacitive touchscreen to be integrated into a highly reliable system thanks to the intrinsically redundant architecture associated with an enhanced crossed input sensing and monitoring. Using the mutual capacitance principle, the capacitive grid and the whole chain of touch sensing, i.e. the channel, can be tested cyclically at a physical level which increases significantly the diagnostic coverage of the touch interface.

Advantageously, the system allows obtaining a capacitive touch screen architecture that exhibits a high diagnostic coverage thanks to a crossed sensing and monitoring of the capacitive function. This is achieved using two independent capacitive touch screen channels but only one capacitive touchscreen divided in two capacitive sub-grids, without adding external or extra elements. Nonetheless, fully redundant touch sensing is achieved along with high diagnostic coverage, which may be suitable for functional safety implementations, among others.

The system allows an enhanced diagnostic coverage of each channel as well as recovering the initial resolution of the original capacitive grid by correlation of the first touch position and the second touch position, using the implementation of a location weighted interpolation.

In an embodiment, the first channel comprises a first sensor controller and a first microcontroller unit, the first sensor controller being communicatively coupled to the first capacitive sub-grid, and wherein the second channel comprises a second sensor controller and a second microcontroller unit, the second sensor controller being communicatively coupled to the second capacitive sub-grid.

In an embodiment, the first channel is tested by the second channel by sending a stimuli signal to the second capacitive sub-grid from the second channel and by retrieving a first test position by the first channel by detecting change in the electrical field in the first capacitive sub-grid, and wherein the second channel is tested by the first channel by sending a stimuli signal to the first capacitive sub-grid from the first channel and by retrieving a second test position by the second channel by detecting change in the electrical field in the second capacitive sub-grid.

In an embodiment, the first microcontroller unit and the second microcontroller unit are configured to communicate directly between them.

In an embodiment, the capacitive grid is divided in the first capacitive sub-grid and the second capacitive sub-grid that have half of the resolution of the capacitive grid.

In an embodiment, the first capacitive sub-grid and the second capacitive sub-grid are independent of each other and are overlapped on the same plane.

In an embodiment, the electric field of one of the first capacitive sub-grid and the second capacitive sub-grid interacts with the electric field of the other of the first capacitive sub-grid and the second capacitive sub-grid.

In an embodiment, the capacitive grid is a projected capacitive grid.

In another implementation, there is provided a method for determining a position of a touch input on a touch screen associated with a capacitive grid, the capacitive grid comprising a first capacitive sub-grid and a second capacitive sub-grid, wherein the first capacitive sub-grid is controlled by a first channel and the second capacitive sub-grid is controlled by a second channel, the method comprising:
getting a first touch position and a second touch position respectively by the first channel and the second channel after a touch input on the touch screen, testing the second channel and the first channel by sending a stimuli signal respectively to the first capacitive sub-grid by the first channel and to the second capacitive sub-grid by the second channel, determining a consolidated touch position by correlation of the first touch position and the second touch position by at least one of the first channel and the second channel.

In another implementation there is provided a computer-readable medium having embodied thereon a computer program for executing a method for determining a position of a touch input on a touch screen associated with a capacitive grid. Said computer program comprises instructions which carry out steps according to the method according to the invention.

BRIEF DESCRIPTION OF THE FIGURES

The detailed description is described with reference to the accompanying figures. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

The same reference number represents the same element or the same type of element on all drawings.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

DESCRIPTION OF EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
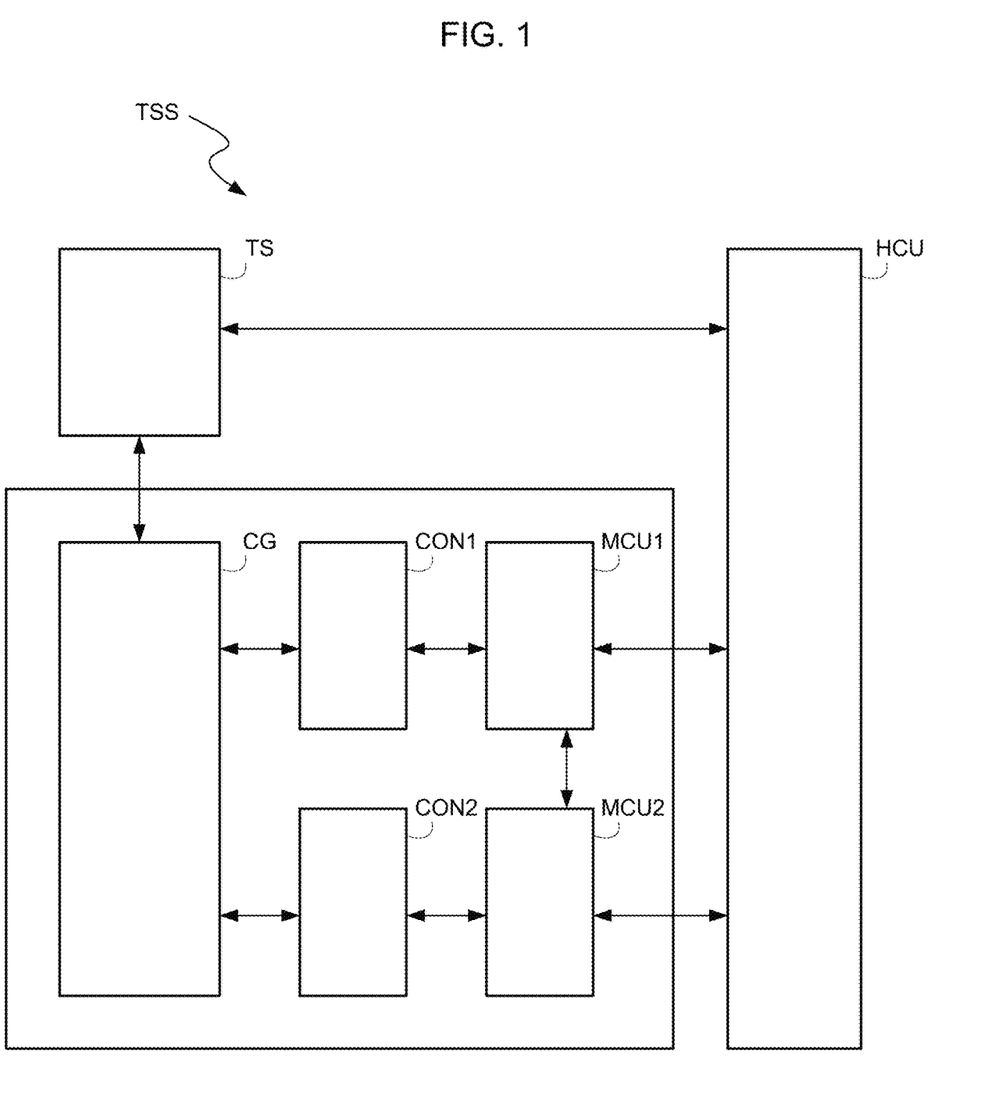
FIG. 1 shows a schematic block diagram of a touch screen system according to one embodiment.

Referring to FIG. 1, a touch screen system TSS comprises a capacitive grid CG, a first sensor controller CON1 linked to a first microcontroller unit MCU1, a second sensor controller CON2 linked to a second microcontroller unit MCU2. The touch screen system TSS is communicating with a host computing unit HCU of an electronic device and the capacitive grid CG is associated with a touch screen TS.

The capacitive grid CG of the touch screen system TSS is operative with the touch screen TS of the electronic device. The touch screen system TSS with the touch screen TS form a touch screen assembly that constitutes a user interface of the electronic device that may be any device using a touch screen.

The touch screen TS may comprise for example an electronic display that is used as a user interface for any device using a display screen like a smartphone, a laptop, a tablet, a car, a home appliance etc.

The touch screen TS may also comprise for example a tactile surface dedicated to specific functionalities (acting like buttons for example) of an electronic device like a laptop, a multimedia device, a home appliance (e.g. control zone for an induction plate), a car (e.g. control zone for multimedia or comfort elements). In another example, the touch screen is a touchpad used in a laptop or any multimedia device. In this case, the touch screen TS may present an opaque surface without any display on it.

In one embodiment, the capacitive grid CG may be wet laminated to the touch screen as an electronic display. A gasket may be provided that frames the capacitive grid CG and the touch screen and creates a seal between them.

The host computing unit HCU implements an operating system that commands the user interface of the electronic device and other components of the electronic device like a microphone, a speaker etc. The host computing unit HCU may implement different communication interfaces which provides means for communication with other devices via different kinds of telecommunication network. In particular, the host computing unit HCU receives data from the first microcontroller unit MCU1 and the second microcontroller unit MCU2 in order to interpret user actions on the touch screen.

The touch screen system TSS is based on a projected capacitive technology. In one embodiment, the capacitive grid CG comprises one sheet piled-up structure that has X and Y electrodes on its surface and backside of one sheet respectively. In another embodiment, the capacitive grid CG comprises a two-sheets-laminated structure consisting of two sheets facing each other with electrodes in between. In the two-sheets-laminated structure, the X electrodes are forming on one glass and the Y electrodes are forming on another glass. The two glass sheets are laminated in the way that two electrode sides are facing. Thus the X and Y electrodes are intersecting in matrix and forming a capacitive grid. The capacitive grid pattern may have different kinds of geometrical layout The projected capacitive technology is using conductivity of human body. When a finger comes close to the patterning of X and Y electrodes, i.e. the capacitive grid, a capacitance coupling will occur between the finger and the electrodes. The capacitance coupling makes the electrostatic capacitance between the X and Y electrodes change. The touch screen system detects touched points as it checks where on the electrode lines the electrostatic capacitance changed.

In other words, bringing a finger or conductive stylus as a touch input near the surface of the capacitive grid changes the local electric field which reduces the mutual capacitance. The capacitance change at every individual point on the capacitive grid can be measured to accurately determine the touch location by measuring the voltage in the other axis.

The grid pattern may have different kinds of geometrical layout, for example in the form of a diamond, interleaved or angle cross pattern.

The first sensor controller CON1 and the second sensor controller CON2 are communicatively coupled to the capacitive grid CG and are communicatively coupled to the host computing unit HCU respectively via the first microcontroller unit MCU1 and the second microcontroller unit MCU2. Each sensor controller CON1, CON2 executes firmware or software and is configured for controlling or analyzing the behavior of a sensor pattern of the capacitive grid.

The first microcontroller unit MCU1 and the second microcontroller unit MCU2 communicate directly between them to form a common interface for host computing unit HCU. Each microcontroller unit is configured to send commands to its respective sensor controller and to analyze measures returned by its respective sensor controller.

Figure 2:
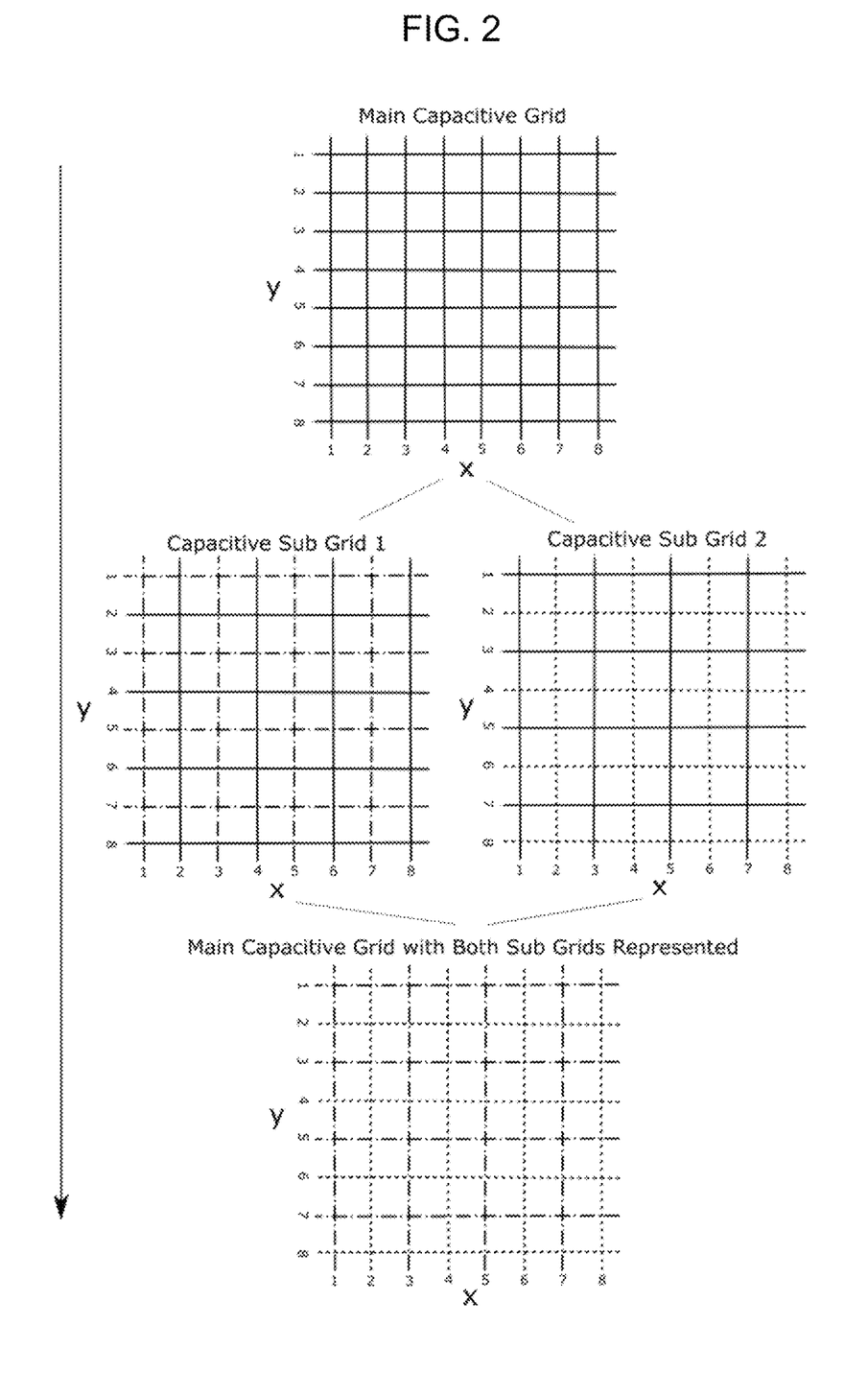
FIG. 2 shows a simplified schematic of a capacitive grid split in two sub-grids.

Referring to FIG. 2, the capacitive grid is divided in two capacitive grids enabling to get redundancy with only sensing component, i.e. the sensor pattern of the capacitive grid. The capacitive grid is assimilated to a main capacitive grid having a first capacitive sub-grid 1 and a second capacitive sub-grid 2 in an overlapped way. Each of the capacitive sub-grids would have half the resolution with respect of the main capacitive grid. For example, each of the capacitive sub-grids is created by using the pair columns and rows for one capacitive sub-grid and the odd columns and rows for the other capacitive sub-grid.

More especially in the example of FIG. 2, the capacitive sub-grid 1 is composed by the columns and rows "1, 3, 5 and 7" represented by "dashdot" lines and the capacitive sub-grid 2 is composed by the columns and rows "2, 4, 6 and 8" represented by "dash" lines.

Figure 3:
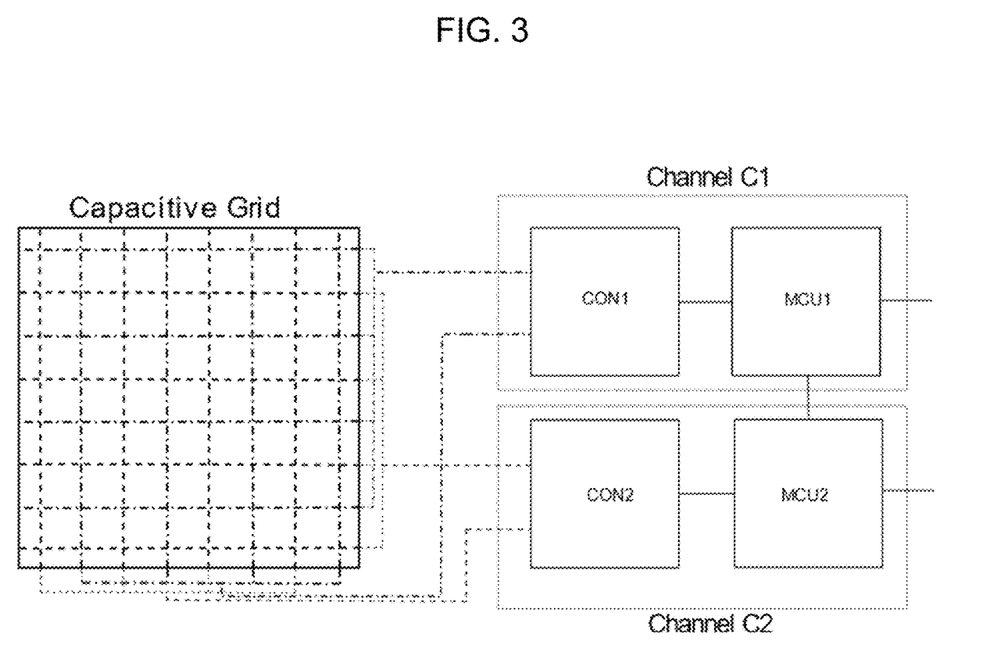
FIG. 3 shows a simplified schematic of a capacitive grid linked to two channels of control.

Referring to FIG. 3, from a hardware point of view, the two capacitive sub-grids of the capacitive grid are respectively linked to a first channel C1 and a second channel C2 and the two capacitive sub-grids are independent of each other, creating an architecture for managing virtually two independent touch screens. The architecture is thus defined with two completely independent channels: the first channel C1 comprises the first sensor controller CON1 and the first microcontroller unit MCU1, and the second channel C2 comprises the second sensor controller CON2 and the second microcontroller unit MCU2. Each channel is associated with a capacitive sub-grid and benefits from half of the resolution of the capacitive grid.

The first channel C1 controls a first capacitive sub-grid represented in "dashdot" lines and the second channel C2 controls a second capacitive sub-grid represented in "dash" lines.

Even though the channels can operate independently, the two capacitive sub-grids do interact with each other at two different levels:
  Electrically since the electric field of one sub-grid interacts with the other,
  Spatially since the two capacitive sub-grids are overlapped on the same plane.

Figure 4:
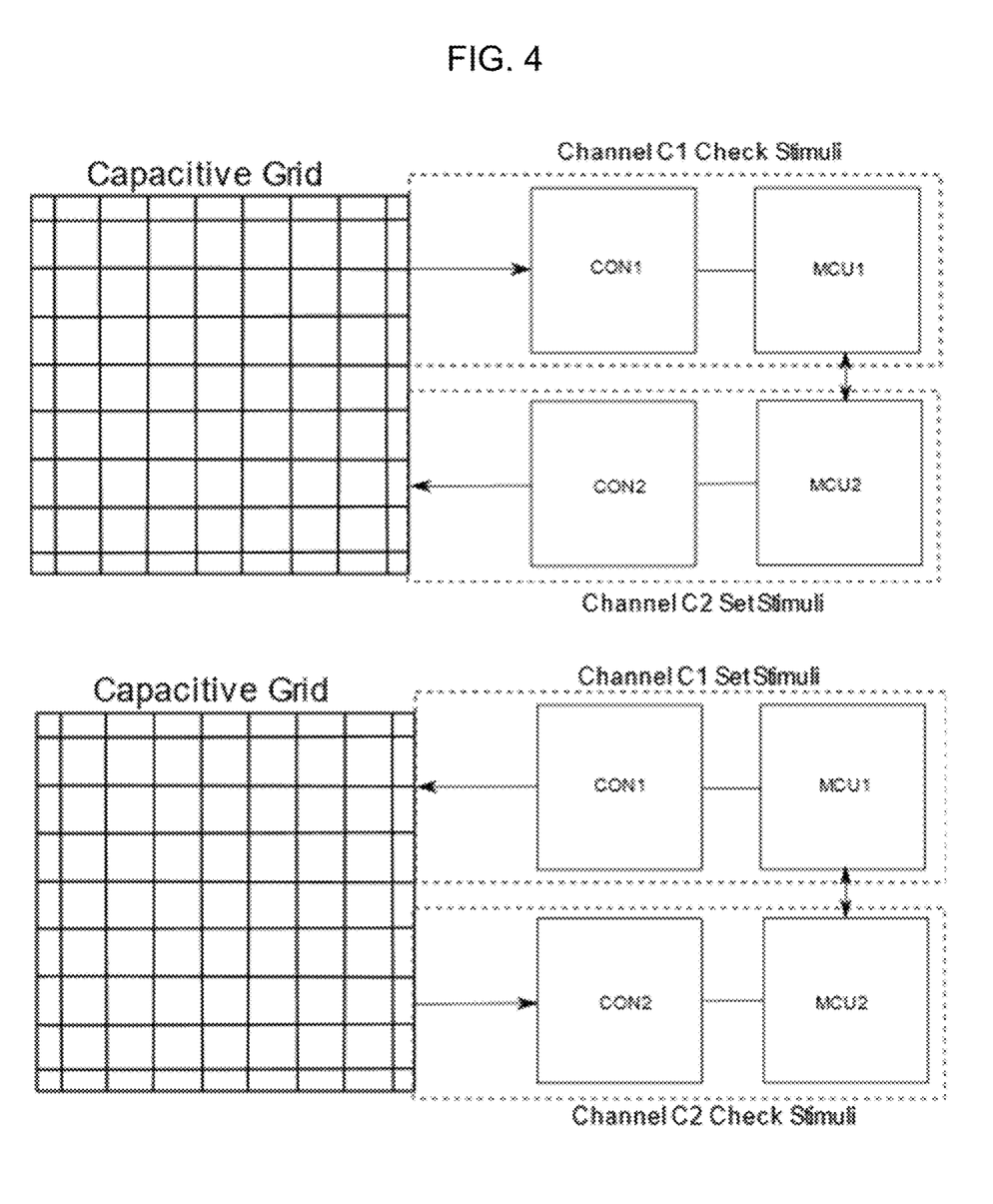
FIG. 4 shows a simplified schematic of a capacitive grid linked to two channels of control setting and checking stimuli.

FIG. 4 illustrates a cyclically diagnostic by the channels checking and setting stimuli alternately.

In the upper part of FIG. 4, the second channel C2 is set to test a first channel C1 by sending a stimuli signal to its corresponding sub-grid. The first channel C1 is able to detect and check the stimuli through a change in the electrical behavior of its corresponding sub-grid.

In the lower part of FIG. 4, the first channel C1 is set to test the second channel C2 by sending a stimuli signal to its corresponding capacitive sub-grid. The second channel C2 is able to detect and check the stimuli through a change in the electrical behavior of its corresponding sub-grid.

The first microcontroller unit MCU1 and the second microcontroller unit MCU2 are linked together to exchange data as well as to synchronize their tasks to effectively determine their respective touch positions and to control the access to the capacitive grid. The interface between the microcontroller units is therefore configured to avoid undesired disturbances between the channels.

Figure 5:
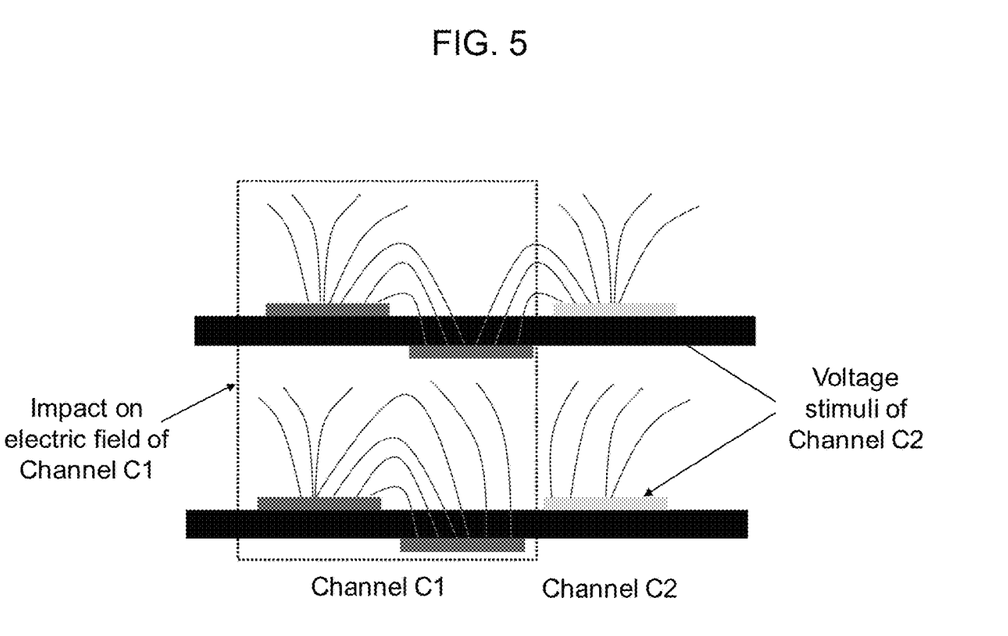
FIG. 5 illustrates the stimuli principle in the projected capacitive grid.

FIG. 5 illustrates the stimuli principle in the projected capacitive grid. As depicted, a change in the voltage in the sub-grid of the first channel C1 to has an impact in the electric field of the sub-grid of the second channel C2. This change of electric field implies a change in capacitance and is therefore detectable by the sensing principle of the sensor controller. Since this detection is carried out using the same sensing principle as the one used for the standard touch sensing, the complete channel is tested from sensing in the sub-grid detecting a touch position to the microcontroller unit acquiring data related to the touch position from the sensor controller.

The test of the second channel C2 is done using the same principle just the other way around. Therefore, the diagnostic coverage of the touch sensing input can be significantly increased. If any failure appears in any of the channels, this cross-input monitoring would allow detecting the failure with a high level of reliability without the need of having an actual touch input in the touch screen TS.

Figure 6:
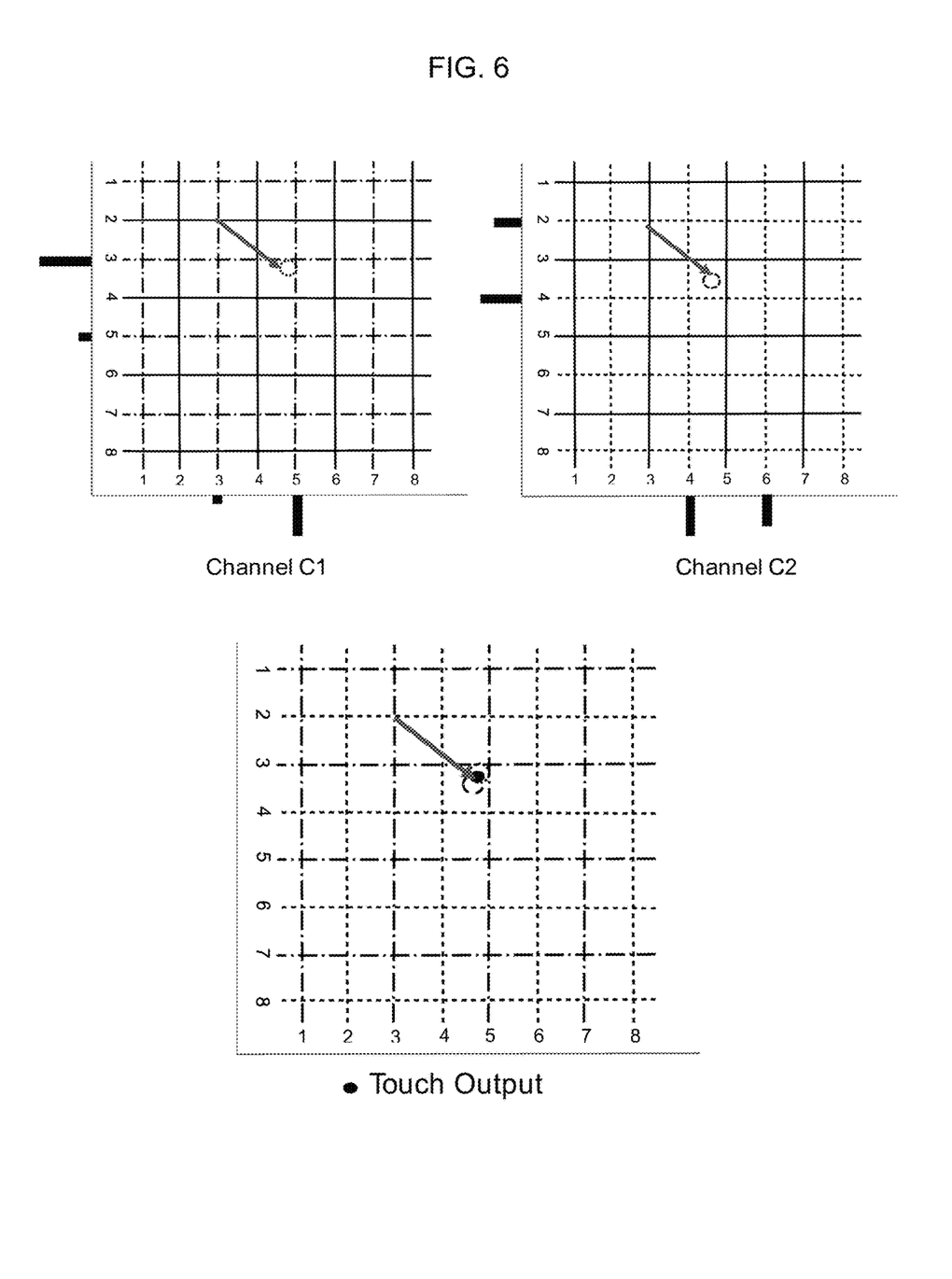
FIG. 6 illustrates the touch position estimation in the projected capacitive grid via two channels of control.

Referring to FIG. 6, due to the spatial interaction between the sub-grids, the information from each channel can be used to enrich the final touch sensing output. Indeed, this spatial overlap allows performing the following
  Merging the information from both sub-grids to achieve a touch precision like the one exhibited in the grid in the lower part of FIG. 6,
  Checking the consistency between the channels C1 and C2.

Each channel can retrieve a touch position in its corresponding sub-grid when a user touches the touch screen. This process is then coordinated between both microcontroller unit by means of the common interface.

In the upper part of FIG. 6, each channel estimates the touch position based on the info of its corresponding capacitive sub-grid. The arrow indicates the point where the touch screen is touched. The controller of the channel performs the corresponding routines to determine the estimated position the capacitive sub-grid.

For example, in the capacitive sub-grid of the first channel C1, represented in "dashdot" lines with rows and columns "1, 3, 5, and 7", the estimated touch position is represented by a circle in a "dot" line. The sensor controller of first channel C1 detects a change in the capacitance of columns "3 and 5" and rows "3 and 5" and retrieves the measures of the capacitance of said rows and columns, with row "3" and column "5" having a capacitance with more weight (in bold line) than row "5" and column "3", meaning that the touch position should be closer to the row "3" and column "5". The first microcontroller unit MCU1 use interpolation algorithm to estimate the touch position from the retrieved measures.

Similarly, in the capacitive sub-grid of the second channel C2, represented in "dashdot" lines with rows and columns "2, 4, 6, and 8", the estimated touch position is represented by a circle in a "dash" line.

In the lower part of FIG. 6, once both channels have estimated a touch position, they exchange this information between each other and estimate a unique touch position output represented by a black circle. This estimation can be done using a weighted interpolation, for example.

The black circle represents the consolidated touch position using the information from both channels. This procedure allows gaining back part of the sacrifice in terms of grid resolution associated with the split of the main capacitive grid into two sub-grids. More importantly in terms of reliability, the consistency of the position data is verified by defining, for example, an area where the touch position of both channels must be contained. If one of the touch positions is outside the define area of validity, the consistency check is not passed, and a diagnostic can be raised.

This consistency check along with the cross-input monitoring allows having a highly reliable touch function with a high failure diagnostic coverage.

Figure 7:
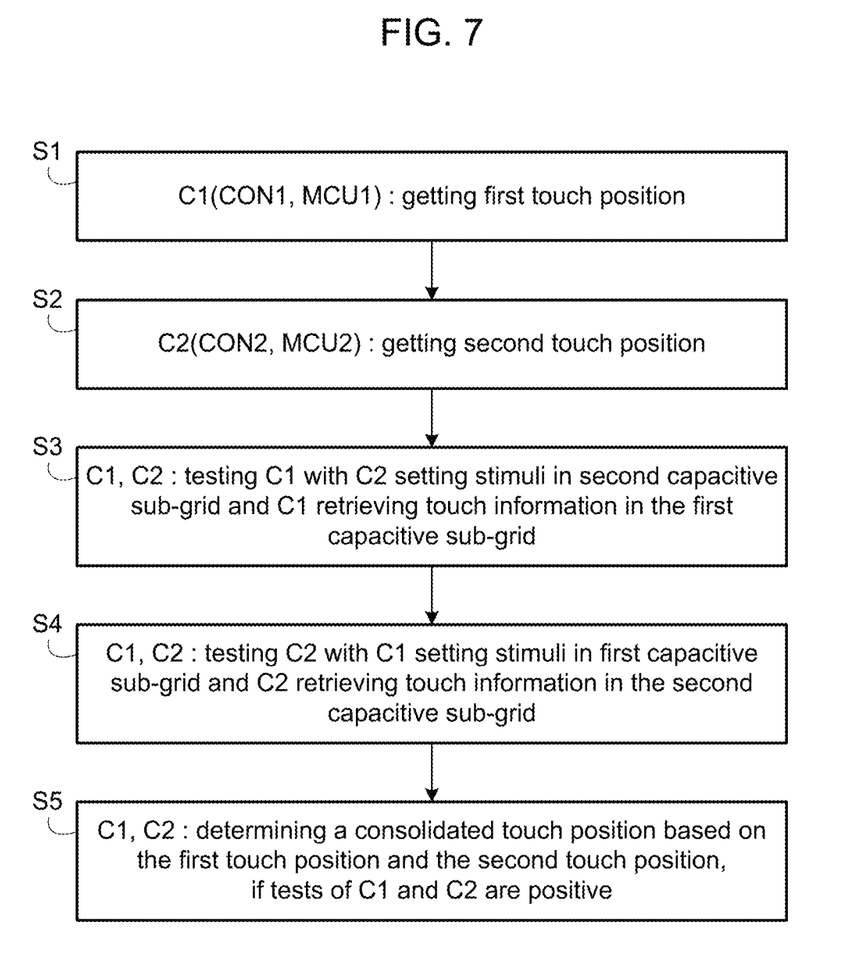
FIG. 7 is a flow diagram of a method determining a position of a touch input on an electronic display associated with a capacitive grid.

With reference to FIG. 7, a method determining a position of a touch input on a touch screen associated with a capacitive grid according to one embodiment of the invention comprises steps S1 to S5.

In step S1, the first microcontroller unit MCU1 commands the second microcontroller unit MCU2 through the common interface to set the second channel C2 in standby mode. The standby mode allows the first channel C1 to obtain the touch position with first capacitive sub-grid without any disturbance from the second channel C2.

The second microcontroller unit MCU2 acknowledges the standby mode of the second channel C2 and the first microcontroller unit MCU1 communicates with the first sensor controller CON1 to launch touch sensing routine.

The first microcontroller unit MCU1 retrieves a first touch position on the first capacitive sub-grid and commands the second microcontroller unit MCU2 to set the second channel C2 out of standby mode.

In step S2, the first microcontroller unit MCU1 sets the first channel C1 in standby mode, in order to allow the second channel C2 to obtain the touch position with the second capacitive sub-grid without any disturbance from the first channel C1.

The first microcontroller unit MCU1 commands the second microcontroller unit MCU2 through the common interface to get touch position from the second channel C2.

The second microcontroller unit MCU2 communicates with the first sensor controller CON1 to launch touch sensing routine.

The second microcontroller unit MCU2 retrieves a second touch position on the second capacitive sub-grid and informs the first microcontroller unit MCU1 that the touch position has been retrieved.

The order of commands by the first microcontroller unit MCU1 and the second microcontroller unit MCU2 can be inverted, the results of the steps S1 and S2 are the touch positions retrieved by the first channel and the second channel. The steps S1 and S2 can be repeated many times to obtain many touch positions. Further steps S3 and S4 to test the first channel and the second channel can be triggered in different ways, for example after a predefined number (that may be variable) of obtained touch positions or after a predefined time limit (that may be variable).

In step S3, the first microcontroller unit MCU1 commands the second microcontroller unit MCU2 through the common interface to test the first channel C1.

The second microcontroller unit MCU2 acknowledges the test mode for the first channel C1 and the second microcontroller unit MCU2 communicates with the second sensor controller CON2 to set the corresponding stimuli.

The second microcontroller unit MCU2 informs the first microcontroller unit MCU1 that the stimuli have been set in the second capacitive sub-grid.

The first microcontroller unit MCU1 communicates with the first sensor controller CON1 to launch touch sensing routine.

The first microcontroller unit MCU1 retrieves a touch position as a first test position on the first capacitive sub-grid and commands the second microcontroller unit MCU2 to set the second channel C2 out of test mode.

The second microcontroller unit MCU2 communicates with the second sensor controller CON2 to remove the corresponding stimuli. The second microcontroller unit MCU2 informs the first microcontroller unit MCU1 that the stimuli has been removed.

In step S4, the first microcontroller unit MCU1 informs the second microcontroller unit MCU2 through the common interface that the second channel C2 will be tested. The second microcontroller unit MCU2 acknowledges being set to test mode.

The first microcontroller unit MCU1 communicates with the first sensor controller CON1 to set the corresponding stimuli The first microcontroller unit MCU1 commands the second microcontroller unit MCU2 through the common interface to get touch position from the second channel C2.

The second microcontroller unit MCU2 communicates with the second sensor controller CON2 to launch touch sensing routine.

The second microcontroller unit MCU2 retrieves a touch position as a second test position on the second capacitive sub-grid and informs the first microcontroller unit MCU1 that the test position has been retrieved The first microcontroller unit MCU1 commands the first sensor controller CON1 to remove the corresponding stimuli.

The first microcontroller unit MCU1 informs the second microcontroller unit MCU2 that the test is finished.

The order of tests in steps S3 and S4 by the first microcontroller unit MCU1 and the second microcontroller unit MCU2 can be inverted, the results of the steps S3 and S4 are the test positions retrieved by the first channel and the second channel.

The stimuli can be set to correspond to any position in the capacitive grid, as the purpose of the test is to check that all the channel from the capacitive sub-grid to the sensor control and the microcontroller unit is working properly.

In step S5, the first microcontroller unit MCU1 sends to the second microcontroller unit MCU2 the results of the retrieved touch position (in step S1) and of the retrieved test position (in step S3), and the second microcontroller unit MCU2 sends to the first microcontroller unit MCU1 the results of the retrieved touch position (in step S2) and of the retrieved test position (in step S4).

The first microcontroller unit MCU1 and the second microcontroller unit MCU2 verify the consistency of the touch positions retrieved from the first channel C1 and the second channel C2.

The first microcontroller MCU1 verifies the consistency of the test position retrieved from the second channel C2 and the stimuli set in the first channel C1. Similarly, the second microcontroller MCU2 verifies the consistency of the test position retrieved from the first channel C1 and the stimuli set in the second channel C2.

The first microcontroller unit MCU1 and the second microcontroller unit MCU2 exchange the consistency results. If consistency results of the first microcontroller unit MCU1 and the second microcontroller unit MCU2 are approved (e.g. below a predefined threshold) then one the first microcontroller unit MCU1 and the second microcontroller unit MCU2 calculates a consolidated touch output by correlation of the first touch position and the second touch position.

If consistency results of the first microcontroller unit MCU1 and the second microcontroller unit MCU2 are not approved, one the first microcontroller unit MCU1 and the second microcontroller unit MCU2 raises a diagnostic routine.

In a general manner, the method for determining a position of a touch input on the touch screen associated with the capacitive grid comprises three main steps:

a) after a touch input on the touch screen, the first channel and the second channel get respectively first touch position and a second touch position. This step can be repeated till a predefined time limit or till a predefined number of touch inputs.

b) the first channel test and the second channel test respectively the second channel and the first channel by sending a stimuli signal respectively to the first capacitive sub-grid and to the second capacitive sub-grid.

c) if the tests are positive, at least one of the first channel and the second channel determine a consolidated touch position by correlation of the first touch position and the second touch position Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments

The invention claimed is:

1. A touch screen system comprising:
a touch screen;
capacitive grid associated with the touch screen and comprising a first capacitive sub-grid and a second capacitive sub-grid;
a first controller configured to control the first capacitive sub-grid; and
a second controller configured to control the second capacitive sub-grid;
wherein the first controller and the second controller are configured to get respectively a first touch position and a second touch position after a touch input on the touch screen,
wherein the first controller is configured to test a second channel associated with the second controller by sending a stimuli signal to the first capacitive sub-grid from the first controller,
wherein the second controller is configured to test a first channel associated with the first controller by sending a stimuli signal to the second capacitive sub-grid from the second controller, and
wherein at least one of the first controller and the second controller are configured to determine a consolidated touch position by correlation of the first touch position and the second touch position.

2. The touch screen system according to claim 1, wherein the first channel is tested by sending the stimuli signal to the second capacitive sub-grid from the second controller and by retrieving a first test position by the first controller by detecting change in the electrical field in the first capacitive sub-grid, and wherein the second channel is tested by sending the stimuli signal to the first capacitive sub-grid from the first controller and by retrieving a second test position by the second controller by detecting change in the electrical field in the second capacitive sub-grid.

3. The touch screen system according to claim 1, wherein the capacitive grid is divided in the first capacitive sub-grid and the second capacitive sub-grid that have half of the resolution of the capacitive grid.

4. The touch screen system according to claim 1, wherein the first capacitive sub-grid and the second capacitive sub-grid are independent of each other and are overlapped on the same plane.

5. The touch screen system according to claim 1, wherein the electric field of one of the first capacitive sub-grid and the second capacitive sub-grid interacts with the electric field of the other of the first capacitive sub-grid and the second capacitive sub-grid.

6. The touch screen system according to claim 1, wherein the capacitive grid is a projected capacitive grid.

7. The touch screen system according to claim 1, wherein the first channel comprises the first controller and the first capacitive sub-grid, and the second channel comprises the second controller and the second capacitive sub-grid.

8. The touch screen system according to claim 1, wherein the first controller comprises a first sensor controller and a first microcontroller unit, the first sensor controller being communicatively coupled to the first capacitive sub-grid, and wherein the second controller comprises a second sensor controller and a second microcontroller unit, the second sensor controller being communicatively coupled to the second capacitive sub-grid.

9. The touch screen system according to claim 8, wherein the first microcontroller unit and the second microcontroller unit are configured to communicate directly between them.

10. A method for determining a position of a touch input on a touch screen associated with a capacitive grid, the capacitive grid comprising a first capacitive sub-grid and a second capacitive sub-grid, wherein the first capacitive sub-grid is controlled by a first controller and the second capacitive sub-grid is controlled by a second controller, the method comprising:
getting a first touch position and a second touch position respectively by the first controller and the second controller after a touch input on the touch screen,
testing a second channel associated with the second controller by sending a stimuli signal to the first capacitive sub-grid by the first controller, testing a first channel associated with the first controller by sending a stimuli signal to the second capacitive sub-grid by the second controller, and determining a consolidated touch position by correlation of the first touch position and the second touch position by at least one of the first controller and the second controller.

11. A non-transitory computer-readable medium having embodied thereon computer-readable instructions, which when executed by a processor cause a touch screen system to perform the method according to claim 10.

12. The method according to claim 10, wherein the first channel comprises the first controller and the first capacitive sub-grid, and the second channel comprises the second controller and the second capacitive sub-grid.

13. The method according to claim 10, wherein the first channel is tested by sending the stimuli signal to the second capacitive sub-grid by the second controller and by retrieving a first test position by the first controller by detecting change in the electrical field in the first capacitive sub-grid, and wherein the second channel is tested by sending the stimuli signal to the first capacitive sub-grid by the first controller and by retrieving a second test position by the second controller by detecting change in the electrical field in the second capacitive sub-grid.

14. A non-transitory computer-readable medium having embodied thereon computer-readable instructions, which when executed by a processor cause a touch screen system to perform the method according to claim 13.

* * * * *